(12) United States Patent
Jang et al.

(10) Patent No.: US 6,436,771 B1
(45) Date of Patent: Aug. 20, 2002

(54) METHOD OF FORMING A SEMICONDUCTOR DEVICE WITH MULTIPLE THICKNESS GATE DIELECTRIC LAYERS

(75) Inventors: Syun-Ming Jang; Chen-Hua Yu; Mong-Song Liang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/902,895

(22) Filed: Jul. 12, 2001

(51) Int. Cl.[7] .......................................... H01L 21/8234
(52) U.S. Cl. ...................... 438/275; 438/216; 438/279; 438/286; 438/287; 438/528; 438/591; 438/981
(58) Field of Search ................................ 438/197, 216, 438/230, 275, 279, 286, 287, 520, 528, 585, 591, 981

(56) References Cited

U.S. PATENT DOCUMENTS

| | | | |
|---|---|---|---|
| 5,254,489 A | 10/1993 | Nakata | 437/40 |
| 5,716,863 A | 2/1998 | Arai | 437/41 |
| 5,763,922 A | 6/1998 | Chau | 257/371 |
| 5,989,962 A | 11/1999 | Holloway et al. | 438/275 |
| 6,048,769 A | 4/2000 | Chau | 438/275 |
| 6,093,661 A * | 7/2000 | Trivedi et al. | 438/769 |
| 6,171,911 B1 * | 1/2001 | Yu | 438/275 |

* cited by examiner

Primary Examiner—Chandra Chaudhari
Assistant Examiner—Jack Chen
(74) Attorney, Agent, or Firm—George O. Saile; Stephen B. Ackerman

(57) ABSTRACT

Process sequences used to simultaneously form a first dielectric gate layer for a first group of MOSFET elements, and a second dielectric gate layer for a second group of MOSFET elements, with the thickness of the first dielectric gate layer different than the thickness of the second gate dielectric layer, has been developed. A first iteration of this invention entails a remote plasma nitridization procedure used to form a thin silicon nitride layer on a bare, first portion of a semiconductor substrate, while simultaneously forming a thin silicon oxynitride layer on the surface of a first silicon dioxide layer, located on second portion of the semiconductor substrate. A thermal oxidation procedure than results in the formation of a thin second silicon dioxide layer, on the first portion of the semiconductor substrate, underlying the thin silicon nitride layer, while the first silicon dioxide layer, underlying the silicon oxynitride component of the composite dielectric layer, only increases slightly in thickness. A second iteration of this invention features the formation of a silicon nitride—first silicon dioxide, composite gate layer, on a first portion of a semiconductor substrate, with the composite gate layer used to retard oxidation during a thermal oxidation procedure used growth to form a second silicon dioxide layer, on a second portion of the semiconductor substrate.

8 Claims, 4 Drawing Sheets

METHOD OF FORMING A SEMICONDUCTOR DEVICE WITH MULTIPLE THICKNESS GATE DIELECTRIC LAYERS

BACKGROUND OF THE INVENTION (1) Field of the Invention

The present invention relates to methods used to fabricate semiconductor devices and more specifically to a method of fabricating a semiconductor device featuring the formation of multiple gate dielectric layers, with various gate dielectric thicknesses, for the multiple elements of the semiconductor device.

(2) Description of Prior Art

The use of complimentary metal oxide semiconductor (CMOS), devices for semiconductor integrated circuit applications, has resulted in the fabrication of both N channel (NMOS), as well as P channel (PMOS), type devices, on the same semiconductor chip, sometimes necessitating a gate dielectric layer for one type channel device different in thickness than the gate dielectric thickness used for the counterpart type device. In addition specific elements in the integrated circuit may demand a specific gate dielectric thickness, again different from the thicknesses used for other type elements of the semiconductor design. A specific thickness of the gate dielectric layer may be needed to optimize the parametrics of that specific element, and thus the performance of the integrated circuit can be influenced by the ability to form several different gate dielectric thicknesses, for the various elements residing on the same semiconductor substrate.

To successfully form multiple thickness, gate dielectric layers, such as thermally grown silicon dioxide layers, on the same semiconductor substrate, the thin gate dielectric layer sometime needs to be formed on a region of the semiconductor substrate that had just been subjected to an HF type solution. The HF solution is used to remove a thick silicon oxide component, used as a gate dielectric layer for a first type element, from an area of the A semiconductor substrate to be used for a second device or element, needing a thinner gate dielectric layer. This sequence can present several shortcomings such as the HF solution finding defects in a photoresist shape used to protect the thicker silicon dioxide gate dielectric component, thus etching pin holes in the thicker gate dielectric layer resulting in subsequent gate shorts or leakage. In addition the thickness needed for the regrown, thinner silicon oxide gate dielectric layer, on the bare portion of semiconductor may be difficult to control when directly growing this thin silicon dioxide layer on a bare semiconductor substrate.

This invention will describe several novel fabrication sequences in which multiple thicknesses for gate dielectric layers are obtained without risking HF attack of the thicker silicon dioxide gate dielectric layer, and also improving the ability to control the thickness of the thin silicon dioxide gate layer. Prior art, such as Holloway et al, in U.S. Pat. No. 5,989,962, as well as Chau, in U.S. Pat No. 6,048,769, describe process sequences and materials used to fabricate gate dielectric layers, with different thicknesses, on the same semiconductor substrate. However these prior arts do not describe the novel process steps, and composite gate dielectric components, used in this present invention.

SUMMARY OF THE INVENTION

It is an objective of this invention to fabricate metal oxide semiconductor field effect transistor (MOSFET), elements on a semiconductor substrate, wherein first gate dielectric layers, at a specific thickness, are formed for first MOSFET elements, while second gate dielectric layers, formed at thicknesses different than the thickness used for the first dielectric layers, are used for second MOSFET elements.

It is another object of this invention to perform a remote plasma nitridization procedure on a first silicon dioxide gate layer located on a first portion of a semiconductor substrate, and on a bare, second portion of the semiconductor substrate, prior to controllably forming a second silicon dioxide gate layer, on the second portion of the semiconductor substrate, with the second silicon dioxide gate layer thinner in thickness than the first silicon dioxide gate layer.

It is still another object of this invention to thermally grow a thin silicon dioxide gate layer on a bare, second portion of a semiconductor substrate, while a thicker, composite silicon nitride—silicon dioxide layer, resides on a first portion of the semiconductor substrate.

In accordance with the present invention methods of forming gate dielectric layers on a first portion of a semiconductor substrate, at a first thickness, while simultaneously forming other gate dielectric layers, at a second thickness, on a second portion of the semiconductor substrate, are described. A first iteration of this invention entails the thermal growth of a first silicon dioxide layer, at a first thickness, on a semiconductor substrate. After removal of the first silicon dioxide layer, from a first portion of the semiconductor substrate, a remote plasma nitridization procedure is performed resulting in the formation of a thin silicon nitride layer on the first portion of the semiconductor substrate, while a thin silicon oxynitride layer is formed on the first silicon dioxide layer, located on a second portion of the semiconductor substrate. A thermal oxidation procedure is then performed to grow a thin, second silicon dioxide layer on the first portion of the semiconductor substrate, underlying the thin silicon nitride layer, while the first silicon dioxide layer, located on the second portion of the semiconductor substrate, underlying the silicon oxynitride layer, increases in thickness, with the re-oxidized, first silicon dioxide layer greater in thickness than the second silicon dioxide layer. A second iteration of this invention employs a composite dielectric layer, comprised of silicon nitride on silicon dioxide, on a first portion of a semiconductor substrate, while the same composite dielectric layer is removed from a second portion of the semiconductor substrate. A thermal oxidation procedure is then employed to grow a thin silicon dioxide layer on the second portion of the semiconductor substrate, while the thickness of the composite dielectric layer, located on a first portion of the semiconductor substrate remains unchanged.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
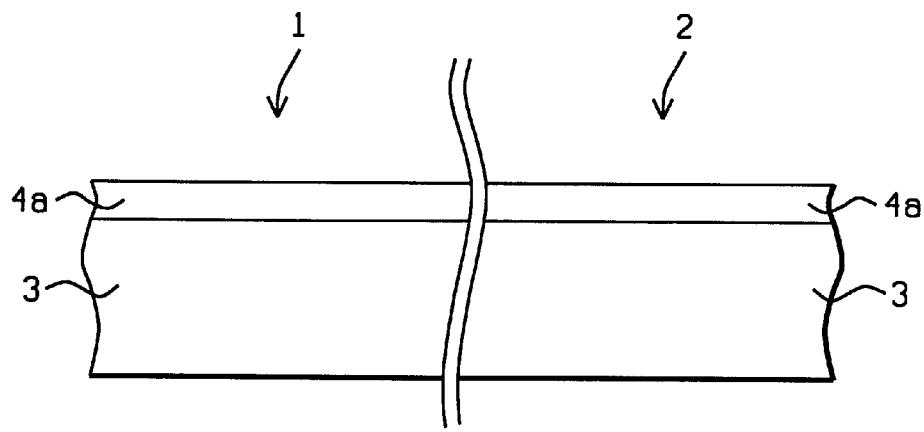
FIGS. 1–5, which schematically in cross-sectional style, describe a first iteration of this invention in which a remote plasma nitridization procedure is used to form a nitrogen containing layer on a first silicon dioxide layer, and on a bare, first portion of a semiconductor substrate, prior to thermally growing a thin, second silicon dioxide gate layer on the bare, first portion of the semiconductor substrate, with the second silicon dioxide gate layer, thinner than the first silicon dioxide gate layer, which in turn is located on a second portion of the semiconductor substrate.
Figure 2:
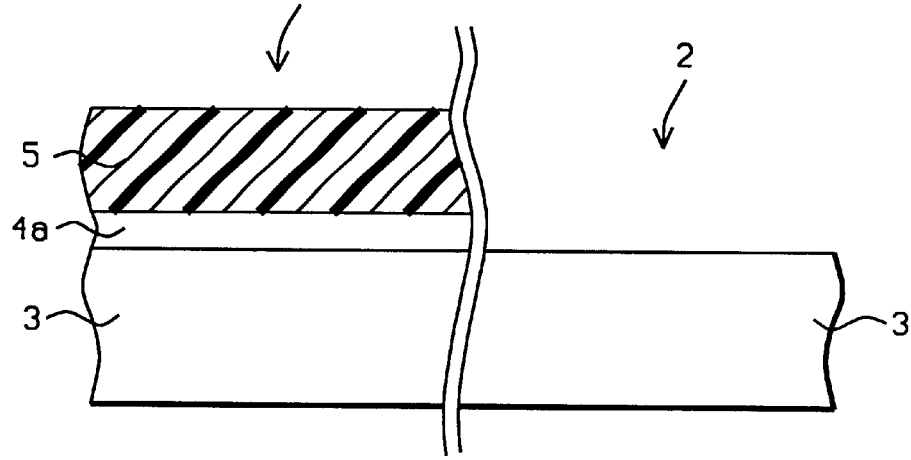

Methods used to form first gate dielectric layers on a first portion of a semiconductor substrate, while simultaneously forming second gate dielectric layers on a second portion of the semiconductor substrate, with the thickness of the first gate dielectric layer, different than the thickness of the second gate dielectric layer, will now be described in detail. A P type semiconductor substrate 3, comprised of single crystalline silicon, with a <100> crystallographic orientation, is used and schematically shown in FIG. 1. Region 1, of semiconductor substrate 3, will be used to form a first gate dielectric layer, while region 2, of semiconductor substrate 3, will be used with a second gate dielectric layer, different in thickness than the first gate dielectric layer. If either region of semiconductor substrate is to be used for P channel (PFET), devices, a N well region, not shown in the drawings, is formed in that region to accommodate the PFET devices A first iteration of this invention featuring the formation of a first gate dielectric layer, formed at a first thickness on a first portion of a semiconductor, and the formation of a second gate dielectric layer, formed at a second thickness, on a second portion of the semiconductor substrate, will now be described. Silicon dioxide layer 4a, shown schematically in FIG. 1, is thermally grown, in an oxygen—steam ambient, to a thickness between about 40 to 60 Angstroms. Photoresist shape 5, is next employed as an etch mask to allow the exposed portion of silicon oxide layer 4a, in region 2, of semiconductor substrate 3, to be removed via exposure to a HF containing solution. This is schematically shown in FIG. 2. Photoresist shape 5, is removed via plasma oxygen ashing and careful wet cleans.

Figure 3:
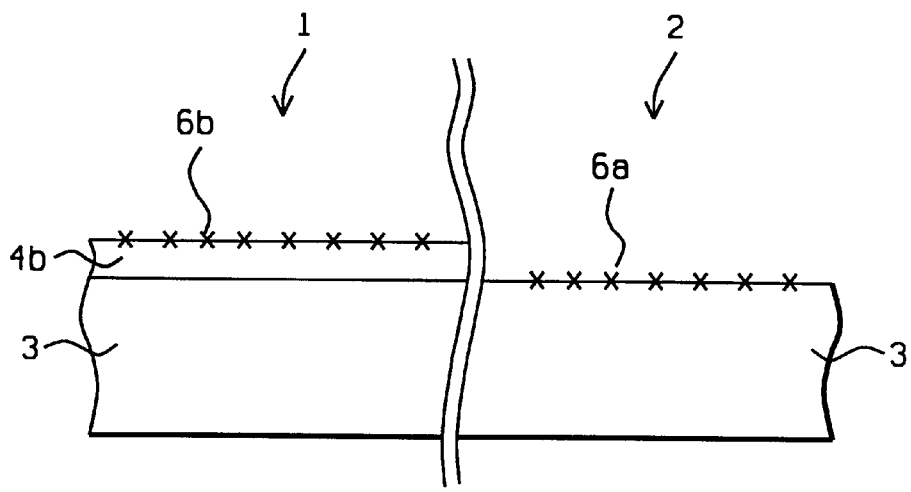
Figure 4:
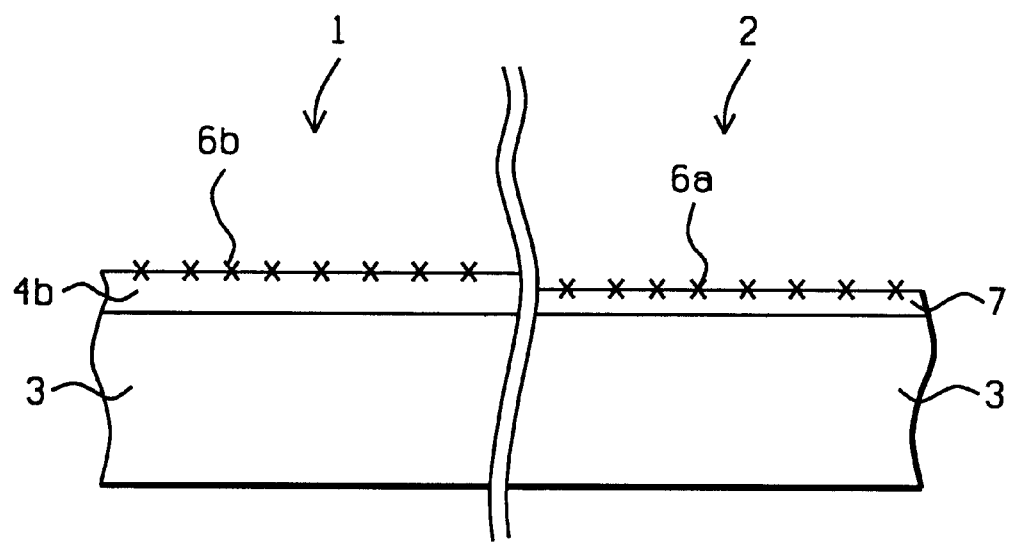

A remote plasma procedure, performed in a nitrogen—helium ambient, for a time between about 30 to 60 sec, at a power between about 100 to 300 watts, is used to form silicon nitride layer 6a, at a thickness between about 20 to 40 Angstroms, on the portion of semiconductor substrate 3, exposed in region 2. The equivalent silicon oxide thickness of silicon nitride layer 6a, is between 10 to 20 Angstroms, based on the dielectric constant for silicon nitride being about twice the dielectric constant for silicon oxide. The same remote plasma procedure results in the formation of nitrogen containing layer 6b, such as silicon oxynitride, at a thickness between about 5 to 10 Angstroms, on the portion of silicon dioxide layer 4a, residing in region 1, of semiconductor substrate 3. This is schematically shown in FIG. 3. A thermal oxidation procedure is next performed, at a temperature between about 800 to 1000° C., in an oxygen—steam ambient, resulting in the formation of thin, silicon dioxide gate insulator layer 7, at a thickness between about 5 to 10 Angstroms, on portion of semiconductor substrate 3, exposed in region 2. The presence of oxidation retarding silicon nitride layer 6a, in region 2, of semiconductor substrate 3, allowed a longer oxidation time to be employed for growth of thin, silicon dioxide gate insulator layer 7, thus improving the controllability of this procedure. The same thermal oxidation procedure results in some additional oxidation in region 1, of semiconductor substrate 3, resulting in silicon dioxide gate insulator layer 6b, now at a thickness between about 50 to 80 Angstroms. The presence of nitrogen containing, silicon oxynitride layer 6b, slowed or retarded the growth of silicon dioxide layer 4b. The result of the thermal oxidation procedure is schematically shown in FIG. 4

Figure 5:
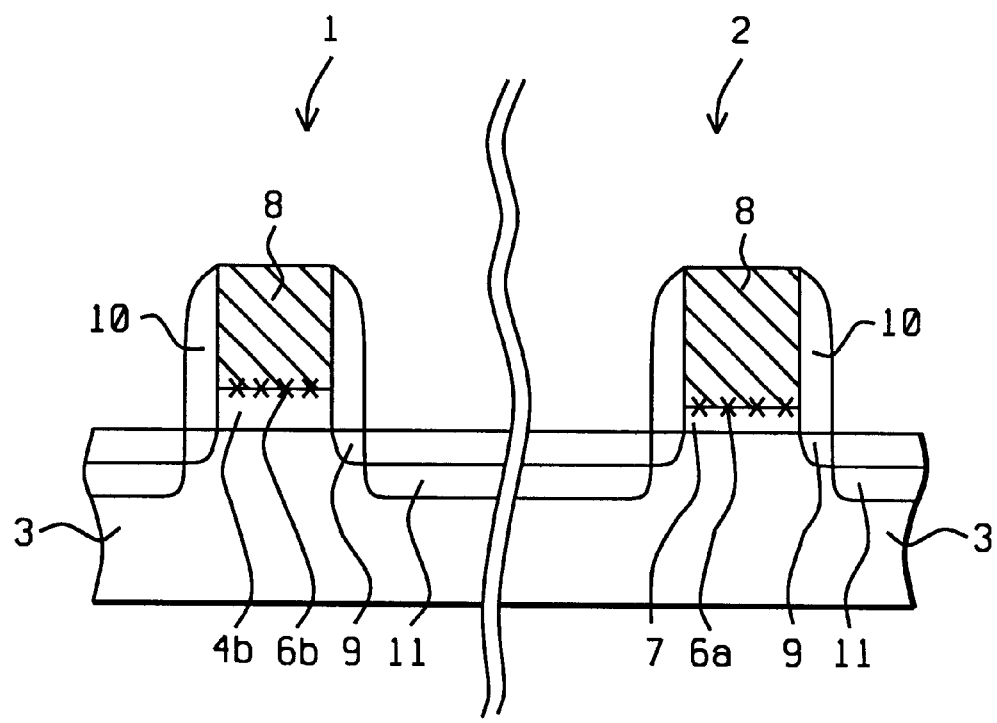

The formation of transfer gate transistors, comprised with a first gate dielectric layer, in turn comprised with silicon dioxide layer 4b, and the formation of additional transfer gate transistors comprised with a thinner, second gate dielectric layer, such as silicon dioxide layer 7, is next described and shown schematically in FIG. 5. If desired, prior to formation gate structures 8, the nitrogen containing layers, silicon oxynitride layer 6b, and silicon nitride layer 6a, can be selectively removed via wet or dry etching procedures. However in this description these nitrogen containing layers will remain. The retention of the nitrogen containing components as part of the gate dielectric layer, results in improvements for some device parametric values. A conductive layer, such as in situ doped, polysilicon, is deposited via low pressure chemical vapour deposition (LPCVD), procedures, at a thickness between about 1000 to 3000 Angstroms. Conventional photolithographic and anisotropic dry etch procedures, are employed to define polysilicon gate structures 8, on the first gate dielectric layer comprised of silicon oxynitride layer 6b, on silicon dioxide layer 4b, and on the second gate dielectric layer comprised of silicon nitride layer 6a, on silicon dioxide layer 7. After removal of the photoresist layer used for definition of polysilicon gate structures 8, lightly doped source/drain ADD), regions 9, are formed in portions of semiconductor substrate 3, not covered by the polysilicon gate structures. If the semiconductor devices are to be N channel devices, LDD regions 9, are formed via implantation of arsenic or phosphorous ions. If however the PFET devices are desired, LDD regions are formed via implantation of boron or $BF_2$ ions. Insulator spacers 10, comprised of silicon oxide or silicon nitride, are next formed on the sides of polysilicon gate structures 8, via deposition of the insulator layer followed by a blanket, anisotropic reactive ion etch procedure. Finally heavily doped source/drain regions 11, are formed in portions of semiconductor substrate 3, not covered by polysilicon gate structures 8, or by insulator spacers 10. Again if NFET devices are being formed, heavily doped source/drain regions are formed via implantation of arsenic or phosphorous ions, where implantation of boron or $BF_2$ ions are used to form the heavily doped source/drain regions for PFET devices.

Figure 6:
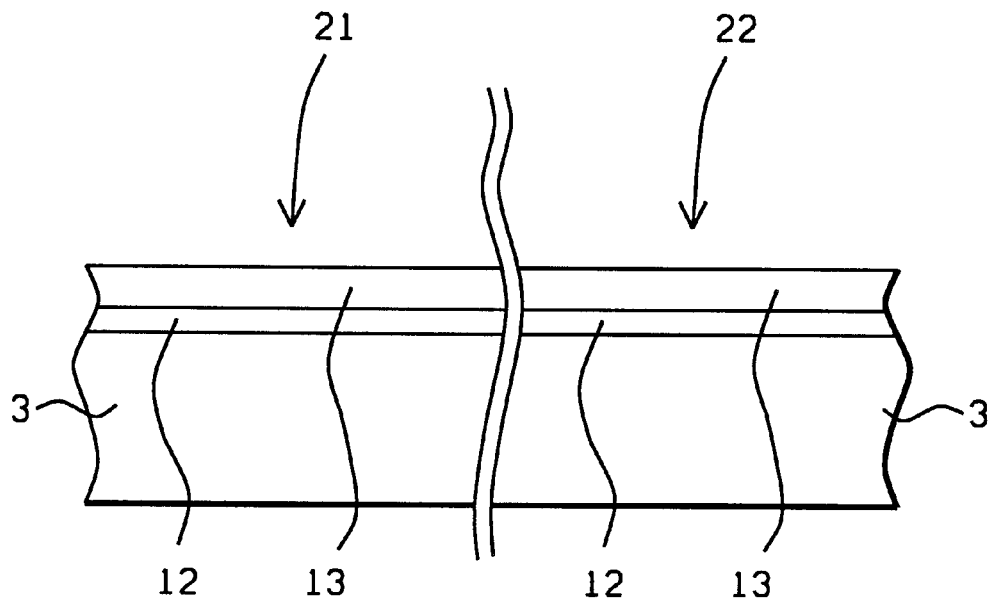
FIGS. 6–9, which schematically in cross-sectional style, describe a second iteration of this invention in which a composite insulator layer, comprised of silicon nitride on silicon oxide, is used to protect a first portion of a semiconductor substrate from a thermal oxidation procedure, used to form a thin, second silicon dioxide layer on a bare, first portion of a semiconductor substrate.

A second iteration of this invention, again featuring the formation of a first gate dielectric layer, formed at a first thickness on a first portion of a semiconductor substrate, and the formation of a second gate dielectric layer, formed at second thickness on a second portion of the semiconductor substrate, is now described, featuring FIGS. 6–9. Region 21, of semiconductor substrate 3, will be used to form a first gate dielectric layer, while region 22, of semiconductor substrate 3, will be used with a second gate dielectric layer, different in thickness than the first gate dielectric layer. A composite dielectric layer, comprised of underlying, silicon dioxide layer 12, and overlying silicon nitride layer 13, is formed on semiconductor substrate 3. Silicon dioxide layer 12, is obtained via thermal oxidation procedures, at a thickness between about 40 to 60 Angstroms, while overlying, silicon nitride layer 13, is obtained via LPCVD or via plasma enhanced chemical vapour deposition (PECVD), procedures, at a thickness between about 20 to 40 Angstroms. This is schematically shown in FIG. 6.

Figure 7:
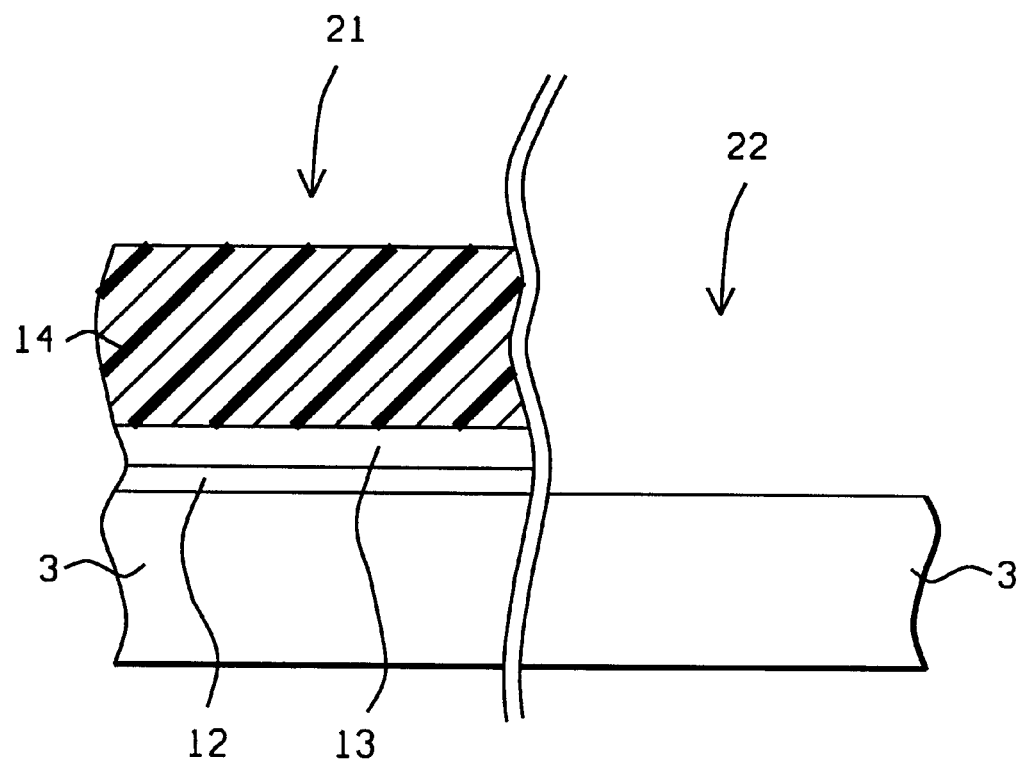
Figure 8:
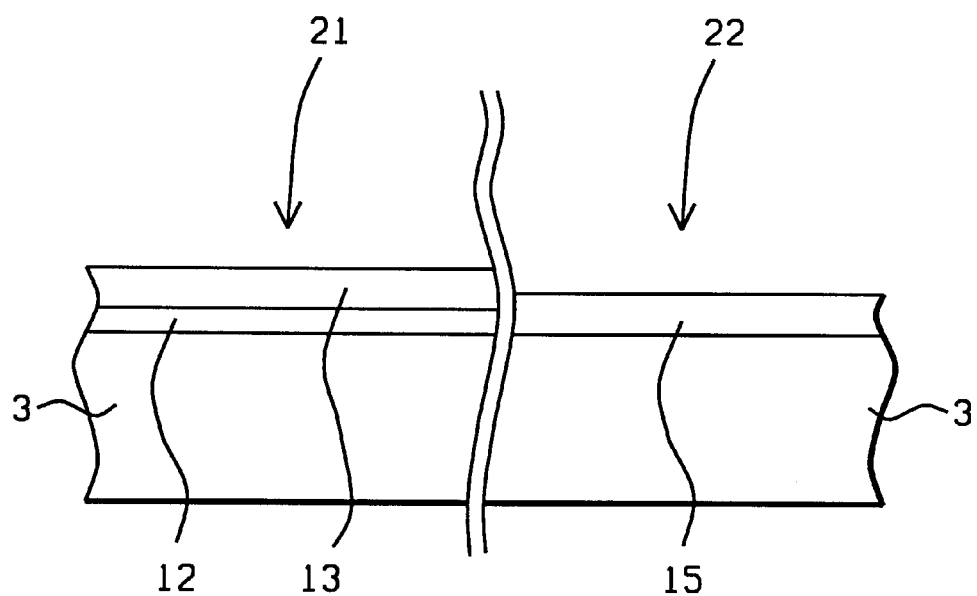

Photoresist shape 14, is next used as an etch mask to allow complete removal of the composite dielectric layer, in region 22, exposing a portion of semiconductor substrate 3. The removal of the composite insulator layer entails removal of silicon nitride layer 13, via a selective dry etch procedure, such as reactive ion etching, using $Cl_2$ as an etchant, with the etching terminating at the appearance of silicon dioxide layer 12. This etch selectivity, or etch rate ratio of silicon nitride to silicon dioxide, prevents the dry etching procedure from attacking silicon dioxide, and more importantly from attacking semiconductor substrate 3. If desired a selective wet etch procedure, using hot phosphoric acid as a selective etchant for silicon nitride layer 13, can be used in place of the dry etching option. After removal of photoresist shape 14, via plasma oxygen ashing and careful wet cleans, portions of silicon dioxide layer 12, exposed in region 22, of semiconductor substrate 3, is selectively removed using a HF containing solution, such as a dilute HF (DHF), or a buffered HF (BHF). The presence of silicon nitride layer 13, in region 21, not soluble in the DHF or BHF solution protects the integrity, or thickness of the composite dielectric layer. The result of this procedure is schematically shown in FIG. 7.

A thermal oxidation procedure is next performed in an oxygen—steam ambient, at a temperature between about 800 to 1000° C., resulting in the formation of thin, silicon dioxide layer 15, at a thickness between about 10 to 20 Angstroms, on the portion of semiconductor substrate 3, exposed in region 22. The excellent oxidation retarding characteristics of silicon nitride layer 13, prevented any additional increase in thickness for silicon dioxide layer 12, located in region 21. Therefore a first gate dielectric layer, located in region 21, comprised of silicon nitride layer 13, and underlying silicon dioxide layer 12, at an equivalent silicon dioxide thickness between about 50 to 80 Angstroms, and a second gate dielectric layer, located in region 22, and comprised of silicon dioxide layer 15, at a thickness between about 10 to 20 Angstroms, was accomplished using the process sequence just described. This is shown schematically in FIG. 8.

Figure 9:
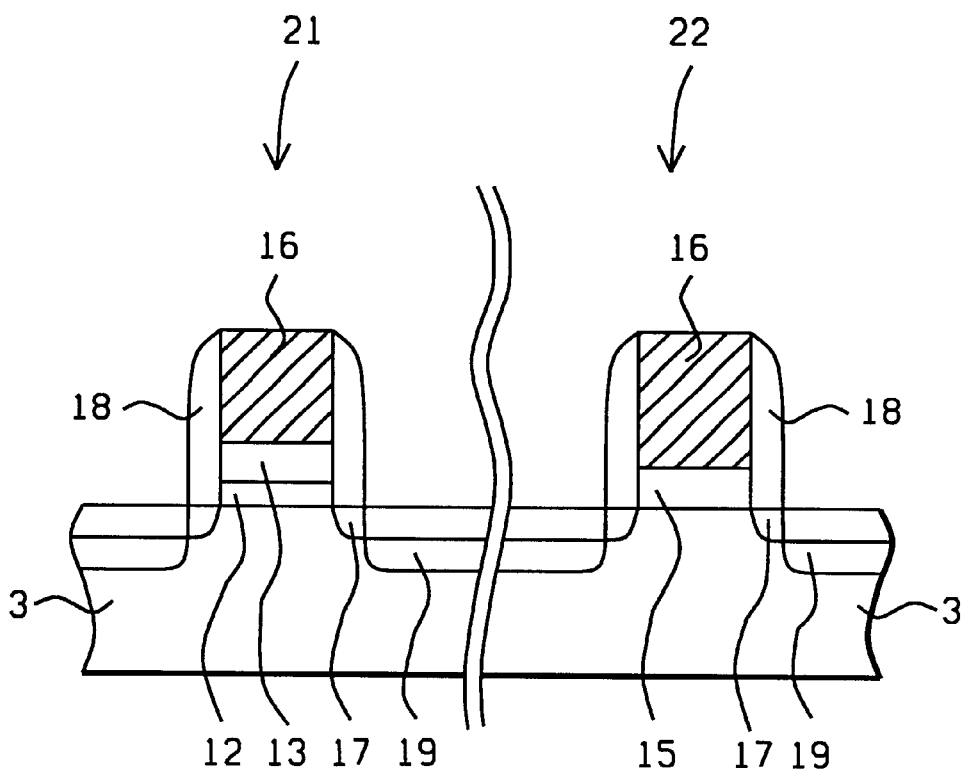

The completion of the transfer gate transistors, featuring a first dielectric gate layer, formed at a first thickness, located in a first region of semiconductor substrate 3, and featuring a second dielectric gate layer, formed at a second thickness, located in a second region of semiconductor substrate 3, is next described and schematically shown in FIG. 9. Polysilicon gate structures 16, are formed, using identical deposition and patterning procedures previously described for polysilicon gate structures 8, in the first iteration of this invention. Lightly doped source/drain regions 17, are then formed in areas of semiconductor substrate 3, not covered by the polysilicon gate structures, again using implantation conditions identical to conditions previously used in the first iteration. Insulator spacers 18, and heavily doped source/drain regions 19, are also formed using deposition, patterning, and implantation procedures, identical to procedures used for counterpart features in the first iteration of this invention.

A third iteration of this invention, not shown in the drawings, features a composite insulator comprised of an overlying silicon nitride layer, at a thickness between about 70 to 100 Angstroms, on an underlying thermally grown silicon dioxide layer, at a thickness between about 10 to 20 Angstroms, presenting an equivalent silicon oxide thickness between about 40 to 70 Angstroms. After removal of the composite insulator layer from a second portion of the semiconductor substrate, another thermal oxidation procedure is performed to grow between about 5 to 10 Angstroms of silicon dioxide on the surface of the second portion of semiconductor substrate. The thickness of the silicon nitride component of the composite insulator layer, located overlying a first portion of the semiconductor substrate, prevented oxidation of the underlying silicon dioxide component. An additional silicon nitride layer is next deposited at a thickness between about 10 to 20 Angstroms, resulting in a composite insulator layer overlying the second portion of the semiconductor substrate. This composite insulator layer, at a silicon dioxide equivalent thickness between about 10 to 20 Angstroms, is comprised of an overlying silicon nitride layer at a thickness between about 10 to 20 Angstroms, and an underlying silicon dioxide layer at a thickness between about 5 to 10 Angstroms. The additional silicon nitride deposition results in an increase in the equivalent silicon oxide thickness for the composite insulator layer located on the first portion of the semiconductor substrate, to a value between about 50 to 80 Angstroms.

While this invention has been particularly shown and described with reference to the preferred embodiments thereof, it will be understood by those skilled in the art that various changes in form and details may be made without departing from the spirit and scope of this invention.

What is claimed is:

1. A method of forming a semiconductor device on a semiconductor substrate, in which a first metal oxide semiconductor field effect transistor (MOSFET), element is formed with a first gate dielectric layer, and in which a second MOSFET element is formed with a second gate dielectric layer, with said first gate dielectric layer different in thickness than said second gate dielectric layer, comprising the steps of:

forming a silicon dioxide layer on said semiconductor substrate;

removing a first portion of said silicon dioxide layer from a first portion of said semiconductor substrate, while a second portion of said silicon dioxide layer remains on a second portion of said semiconductor substrate;

performing a plasma treatment in a nitrogen ambient to form a first nitrogen containing layer on the surface of said second portion of said silicon dioxide layer, and to form a second nitrogen containing layer on the surface of said first portion of said semiconductor substrate;

performing a thermal oxidation procedure to form a thin silicon dioxide layer on said first portion of said semiconductor substrate, resulting in said first gate dielectric layer comprised of said second nitrogen containing layer on said thin silicon dioxide layer, and converting said second portion of said silicon dioxide layer to a thicker second portion of silicon dioxide layer, resulting in said second gate dielectric layer, comprised of said first nitrogen containing layer on said thicker second portion of said silicon dioxide layer, with said second gate dielectric layer greater in thickness than said first gate dielectric layer; and forming gate structures, lightly doped source/drain regions, insulator spacers on the sides of said gate structures, and heavily doped source/drain regions, to complete fabrication of said first MOSFET and of said second MOSFET elements.

2. The method of claim 1, wherein said silicon dioxide layer is obtained at a thickness between about 40 to 60 Angstroms, via thermal oxidation procedures, performed in an oxygen—steam ambient.

3. The method of claim 1, wherein said plasma treatment, is a remote plasma procedure, performed in a nitrogen—helium ambient, for a time between about 30 to 60 sec, at a power between about 100 to 300 watts.

4. The method of claim 1, wherein said first nitrogen containing layer, formed on said second portion of said silicon dioxide layer, is a silicon oxynitride layer, formed at a thickness between about 5 to 10 Angstroms.

5. The method of claim 1, wherein said second nitrogen containing layer, formed on said first portion of said semiconductor substrate, is a silicon nitride layer, formed at a thickness about 20 to 40 Angstroms.

6. The method of claim 1, wherein said thermal oxidation procedure is performed in an oxygen—steam ambient, at a temperature between about 800 to 1000° C.

7. The method of claim 1, wherein the thickness of said thin silicon dioxide layer, located on said first portion of said semiconductor substrate, is between about 5 to 10 Angstroms.

8. The method of claim 1, wherein the thickness of said thicker second portion of said silicon dioxide layer, located on said second portion of said semiconductor substrate, is between about 50 to 80 Angstroms.

* * * * *